United States Patent [19]

Hershcovitch et al.

[11] Patent Number: 5,733,418
[45] Date of Patent: Mar. 31, 1998

[54] SPUTTERING METHOD AND APPARATUS

[75] Inventors: Ady I. Hershcovitch, Mt. Sinai, N.Y.; Vincent J. Kovarik, Melbourne; Kenneth H. Frederick, Rockledge, both of Fla.

[73] Assignees: PLD Advanced Automation Systems, Inc., Rockledge, Fla.; Francis L. Conte, Swampscott, Mass.

[21] Appl. No.: 646,149

[22] Filed: May 7, 1996

[51] Int. Cl.$^6$ .................................................. C23C 14/34
[52] U.S. Cl. .................... 204/192.11; 204/192.12; 204/298.05; 204/298.07; 204/298.16; 204/298.21; 204/298.23; 204/298.26; 204/298.04; 204/298.12; 204/298.06; 204/298.22
[58] Field of Search ................ 204/192.11, 192.12, 204/298.05, 298.06, 298.07, 298.08, 298.16, 298.18, 298.21, 298.22, 298.23, 298.26, 298.27, 298.12, 298.11, 298.04

[56] References Cited

U.S. PATENT DOCUMENTS

| | | | |
|---|---|---|---|
| 4,155,825 | 5/1979 | Fournier | 204/298.16 |
| 4,166,018 | 8/1979 | Chaplin | 204/192 R |
| 4,175,029 | 11/1979 | Kovalsky et al. | 204/298.06 |
| 4,356,073 | 10/1982 | McKelvey | 204/192 R |
| 4,422,916 | 12/1983 | McKelvey | 284/192 |
| 4,588,490 | 5/1986 | Cuomo et al. | 204/298.06 |
| 4,728,862 | 3/1988 | Kovarik et al. | 315/110.01 |
| 4,885,070 | 12/1989 | Campbell et al. | 204/298.06 |
| 4,960,753 | 10/1990 | Collins et al. | 204/298.06 |
| 5,272,735 | 12/1993 | Bryan et al. | 204/298.21 |
| 5,346,600 | 9/1994 | Nieh et al. | 204/298.06 |

FOREIGN PATENT DOCUMENTS 6-287751  10/1994  Japan ................... 204/298.06

OTHER PUBLICATIONS

Vossen et al, "Thin Film Processes," 1978, pp: Cover, copyright, v, 11–15, 24–33, 75–95, 115–119, and 131–137.
Stacey, Jr., "Fusion Plasma Analysis," 1981, pp: Cover, copyright, 318, and 319.
Hershcovitch et al, "High-Intensity H$^-$ Ion Source With Steady-State Plasma Injection," May 1986, Rev. Sci. Instrum. 57(5).
Hershcovitch et al., "High Intensity H ion source with Steady-State Plasma Injection," Rev. Sci. Instrum. 57(5), May 1986.

Primary Examiner—R. Bruce Breneman
Assistant Examiner—Rodney G. McDonald
Attorney, Agent, or Firm—Francis L. Conte

[57] ABSTRACT

A method and apparatus are provided for sputtering particles from a target as a film on a substrate. The target and substrate are maintained in a main housing in a first vacuum. The target is biased with a first negative voltage to effect a target bias. A plasma is produced in a cathode box spaced from the target, with the plasma being injected between the target and substrate to effect sputtering by bombarding the target with positive ions and liberating target particles for condensing on the substrate to form the film. The cathode box includes a cathode biased at a second negative voltage to effect a cathode bias, and a sputtering gas is supplied adjacent to the cathode for producing the plasma. Plasma production in the cathode box is decoupled from sputtering at the target for increasing sputtering yield and rate. And, the target may be contoured for focussing the sputtered particles on the substrate.

47 Claims, 8 Drawing Sheets

SPUTTERING METHOD AND APPARATUS

BACKGROUND OF THE INVENTION

The present invention relates generally to plating thin films on substrates, and, more specifically, to plasma sputter deposition.

Sputtering is a conventional process wherein a sputtering gas is used to form a plasma adjacent to a target formed of a material for being deposited onto an adjacent substrate, all maintained within a common vacuum. A plasma contains ionized gas with positive ions and electrons. The positive ions strike the target and remove mainly neutral target atoms by momentum transfer, and these liberated atoms condense into a thin film on the surface of the substrate.

In sputter deposition, surfaces subject to ion bombardment are usually considered as the source of material from which films are grown. In addition to the neutral sputtered material liberated from the bombarded surface which eventually condenses as a film on the substrate, there are numerous other events that can occur at the target surface which can influence the growth of films profoundly. These include secondary electron emission, secondary positive and/or negative ion emission, emission of radiation such as photons and x-rays, reflection of incident particles, heating, chemical dissociation or reaction, bulk diffusion, crystallographic changes, and reflection of some of the emitted particles back to the bombarded surface which is known as backscattering. The sputtering process is therefore complex since other particles and radiation are also produced at the target which may affect both the generation of the plasma itself as well as the sputtering process which deposits the film on the substrate.

More specifically, the target which defines the source of sputtered particles, such as atoms and molecules, is joined to a power supply and maintained at a suitable negative voltage to also define a cathode. Plasma generation and sputtering both utilize the common cathode/target maintained at a common vacuum pressure within a common vacuum chamber, and also with a common power supply. Accordingly, various operating parameters must be suitably controlled to control both plasma formation and sputtering for maximizing the sputtering rate of the film deposited on the substrate in a desirably uniform thickness, and while maximizing the utilization of the target itself which is consumed during the sputtering process.

The most fundamental parameter of the sputtering process is the sputtering yield which is defined as the number of atoms ejected from the target surface per incident ion bombardment. The sputtering yield determines the erosion rate of the sputtering target and significantly, but not completely, determines the deposition rate of sputtered film on the substrate.

Since plasma production and sputtering are interrelated or coupled in conventional sputtering apparatus, the sputtering yield is affected by both processes. A typical plasma known as a glow discharge is formed in a low pressure gas using a high impedance DC power supply, for example. The sputtering gas provides a current path with the cathode, and ions in the gas strike the cathode releasing secondary electrons which form more ions by collision with neutral gas atoms. When the number of the electrons generated is just sufficient to produce enough ions to regenerate the same number of electrons, the discharge is self-sustaining and the gas produces a plasma glow. The resulting plasma is then used in the sputtering process to liberate sputtered particles from the target which undergo yet another process of deposition on the substrate.

Crucial to the formation of the plasma is the breakdown voltage which sustains the plasma formation and is primarily dependent upon the mean-free-path of secondary electrons in the sputtering gas. If the gas pressure is too low, the secondary electrons cannot undergo a sufficient number of ionizing collisions and the plasma cannot be maintained. If the gas pressure is too large, ions generated in the gas are slowed by inelastic collisions so that they strike the cathode with insufficient energy to produce secondary electrons.

The sputtering deposition process, in contrast, has generally opposite requirements. The vacuum gas pressure should be as low as possible for reducing the attenuation of sputtered atoms and molecules to increase the rate of deposition on the substrate. Accordingly, the desired higher pressure for promoting plasma generation correspondingly decreases deposition rate. Or, the desired lower vacuum pressure for enhancing deposition rate degrades plasma formation.

Furthermore, performance of plasma generation and sputtering are also controlled by the magnitude of the voltage bias on the cathode target. Both target bias and vacuum pressure are therefore typically selected in a compromise for promoting suitable plasma generation with a corresponding sputtering rate, neither of which can possibly be optimized without adversely affecting the other.

A glow discharge is a relatively inefficient ion source. Only a few percent of the gas atoms in a glow discharge are ionized. Several techniques are conventionally known for increasing the ionization efficiency and include for example applying a magnetic field adjacent to the target in which the plasma is generated and sputtering occurs. In a conventional magnetron, a magnetic field is used in concert with the cathode target surface to form electron traps configured so that electron drift currents close on themselves. A magnetic field applied parallel to the cathode surface can restrain primary electron motion adjacent to the cathode and thereby increase ionization efficiency. However, the ionization efficiency is nevertheless relatively low at a few percent ionization, and therefore self-sustained plasma discharge cannot be maintained at low vacuum pressures. Typical vacuum pressures in conventional magnetrons is within the range of about 10–120 mTorr. And, the target bias is maintained at several kilovolts for producing acceptable performance of both plasma formation and sputtering.

In a conventional planar magnetron, a non-uniform plasma discharge distribution is effected across the target resulting in non-uniform sputtering over the substrate, and with poor target utilization. The applied magnetic field correspondingly confines the sputtering process and causes pronounced tracking regions where sputtered material is liberated from the target. This problem is ameliorated by the conventional rotatable magnetron cathode, but angular dispersion of sputtered material is worsened due to the convex geometry of the cathode causing poor atomic particle optics. Therefore, in some applications, much of the sputtered material does not reach the substrate and is lost due to the dispersion.

Yet another problem with conventional sputter deposition is the inability to sputter deposit films on the inside of hollow substrates, which is due in part to the coupling of plasma generation and sputter deposition.

Accordingly, it is desired to provide an improved method and apparatus overcoming these and other problems inherent in conventional sputtering magnetrons.

SUMMARY OF THE INVENTION

A method and apparatus are provided for sputtering particles from a target as a film on a substrate. The target and substrate are maintained in a main housing in a first vacuum. The target is biased with a first negative voltage to effect a target bias. A plasma is produced in a cathode box spaced from the target, with the plasma being injected between the target and substrate to effect sputtering by bombarding the target with positive ions and liberating target particles for condensing on the substrate to form the film. The cathode box includes a cathode biased at a second negative voltage to effect a cathode bias, and a sputtering gas is supplied adjacent to the cathode for producing the plasma. Plasma production in the cathode box is decoupled from sputtering at the target for increasing sputtering yield and rate.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DESCRIPTION OF THE PREFERRED EMBODIMENT(S)

Figure 1:
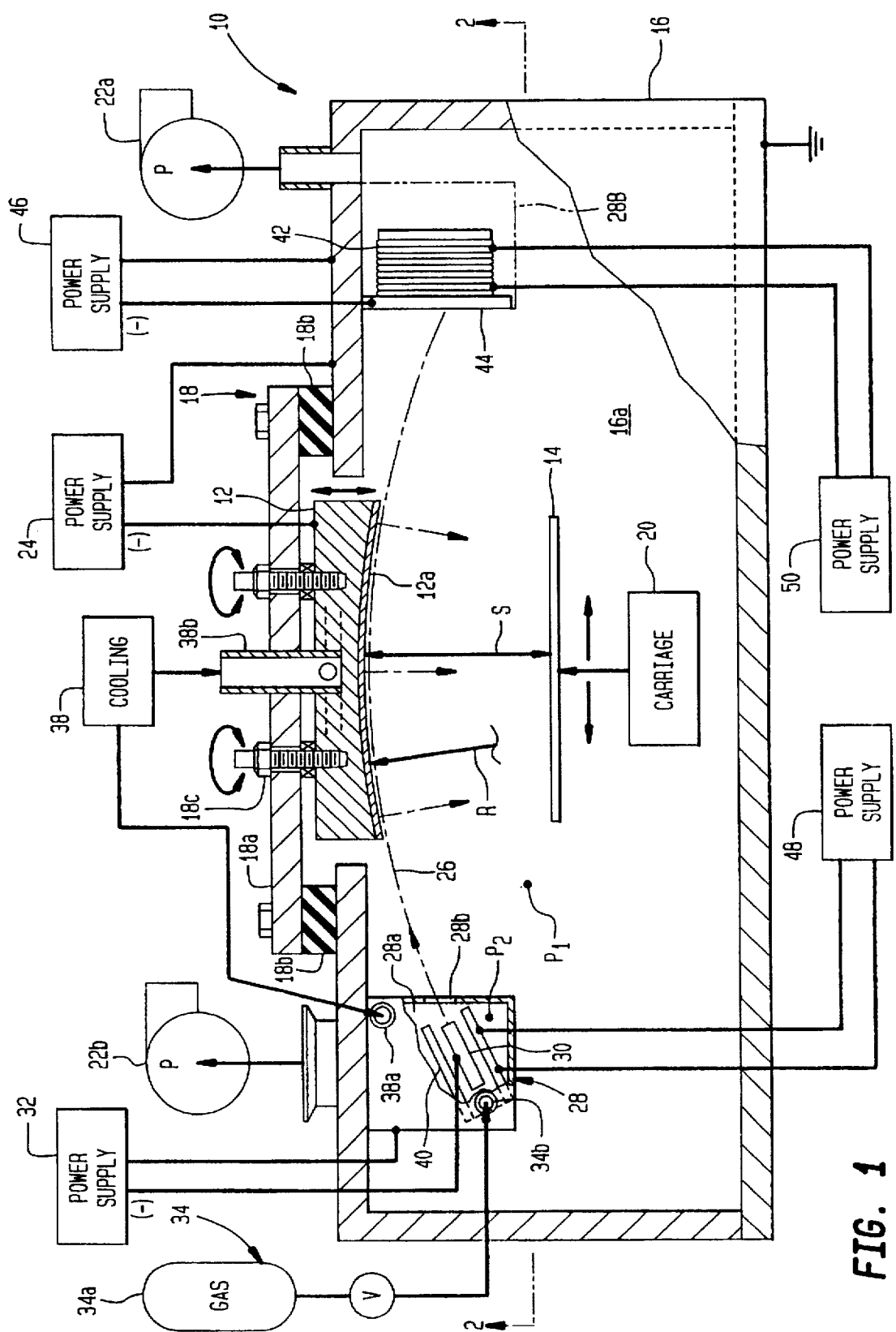
FIG. 1 is a schematic, partly sectional top view of an apparatus for sputtering particles from a target as a film on a substrate in accordance with one embodiment of the present invention.
Figure 2:
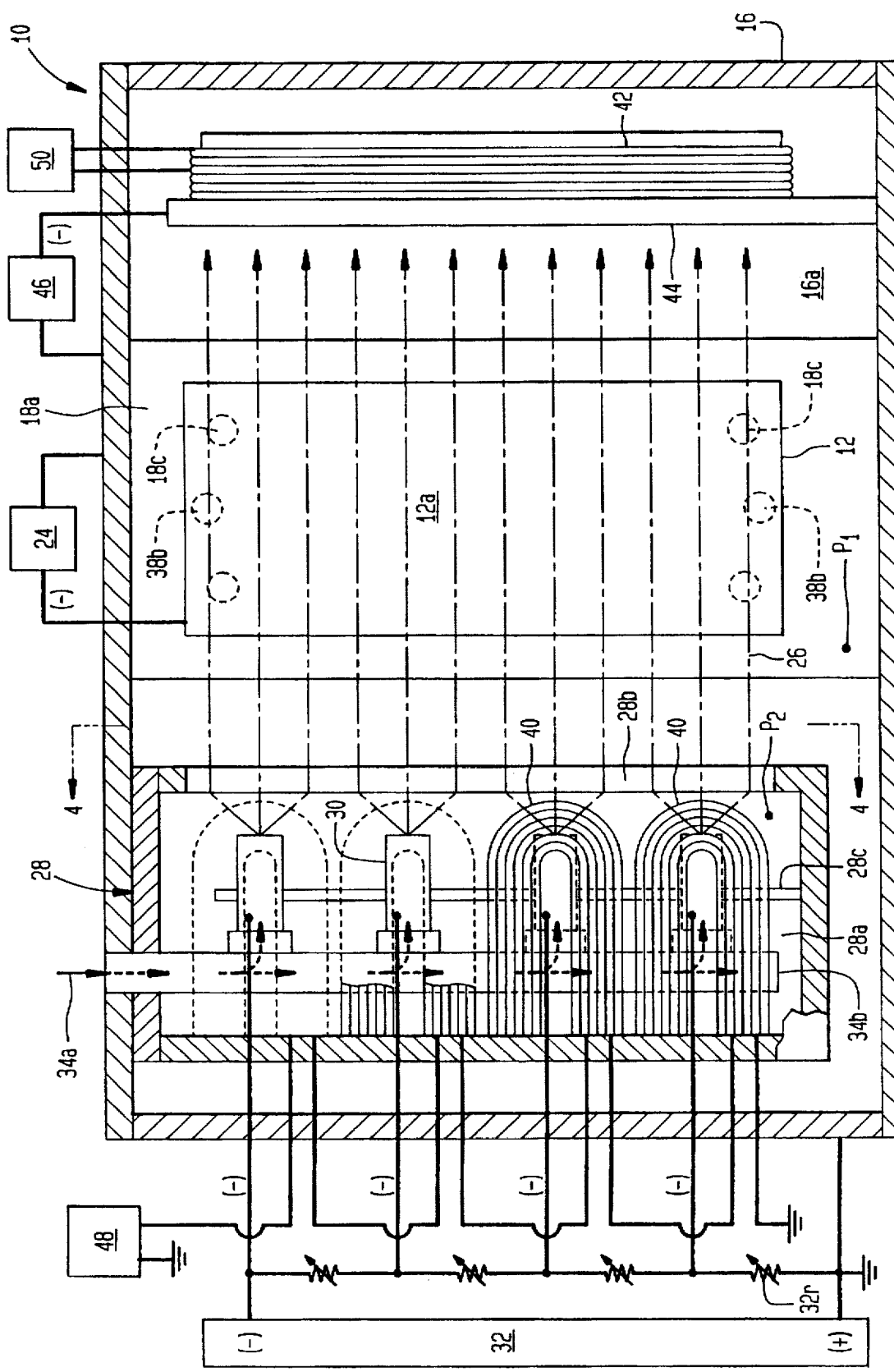
FIG. 2 is a front, elevational, partly sectional view of the sputtering apparatus illustrated in FIG. 1 and taken along line 2—2 showing a cathode box and cooperating reflector on opposite lateral sides of the target in accordance with an exemplary embodiment.

Illustrated schematically in FIGS. 1 and 2 is a sputtering apparatus 10 in accordance with an exemplary embodiment of the present invention. The apparatus 10 is an assembly of components for sputtering or ion plating particles from a target 12 as a deposition film on a workpiece or substrate 14.

The apparatus 10 includes a main housing 16 defining an enclosed main chamber 16a. Means 18 are provided for removably and adjustably mounting the target 12 inside the main chamber 16a at one wall thereof. The target mounting means 18 in accordance with an exemplary embodiment includes a flat mounting plate 18a fixedly joined over an opening in the back wall of the housing 16 by a plurality of conventional screw fasteners therethrough. In order to electrically insulate the target 12 from the housing 16, suitable electrical insulators 18b are disposed between the mounting plate 18a and the housing 16 and are suitably sealed thereto for maintaining a vacuum tight housing 16.

A plurality of threaded fasteners 18c, for example four disposed at the four corners of the target 12, extend through the mounting plate 18a and threadingly engage the back of the target 12, with suitable seals being provided around the fasteners for maintaining the vacuum tight housing 16. By rotating each of the fasteners 18c at the four corners of the target 12 the orientation within the main chamber 16a may be adjusted as desired relative to the substrate 14.

The substrate 14 itself may take any suitable and conventional form such as the flat plate illustrated in FIG. 1, and may be suitably fixedly or movably mounted within the chamber 16a. For example, means in the form of a carriage 20 are disposed inside the housing 16 for movably mounting the substrate 14 inside the chamber 16a to space the substrate 14 from and face it toward the target 12. In the exemplary embodiment illustrated, both the target 12 and the substrate 14 are generally coextensive in configuration with both having substantially rectangular profiles, and being spaced substantially parallel to each other at a predetermined perpendicular spacing S therebetween. The carriage 20 may take any conventional form including rollers or conveyor belt, for example, for selectively translating the substrate 14 laterally relative to the target 12 for sputter plating a film over the entire front surface of the substrate 14 as desired.

Means in the form of a first vacuum pump 22a are operatively joined through a suitable conduit to the chamber 16a for drawing and maintaining a first vacuum therein at a first pressure $P_1$. In this way, both the target 12 and substrate 14 may be maintained in the first vacuum in the main chamber 16a for undergoing sputtering deposition on the substrate 14. The entire target 12 may be formed of any desired and conventional sputtering material for being deposited on the top surface of the substrate 14, which itself is formed of a corresponding and conventional material. The target 12 includes a front face 12a which faces the opposing top face of the substrate 14, and from which sputtered particles are liberated during the sputtering process. If desired, only the front face 12a of the target 12 may be formed of the sputtering material coated on the target 12, with the target base being any other suitable material, if desired. In either configuration, the target 12 includes suitable material at its face 12a for deposition upon the substrate 14 by sputtering.

Figure 3:
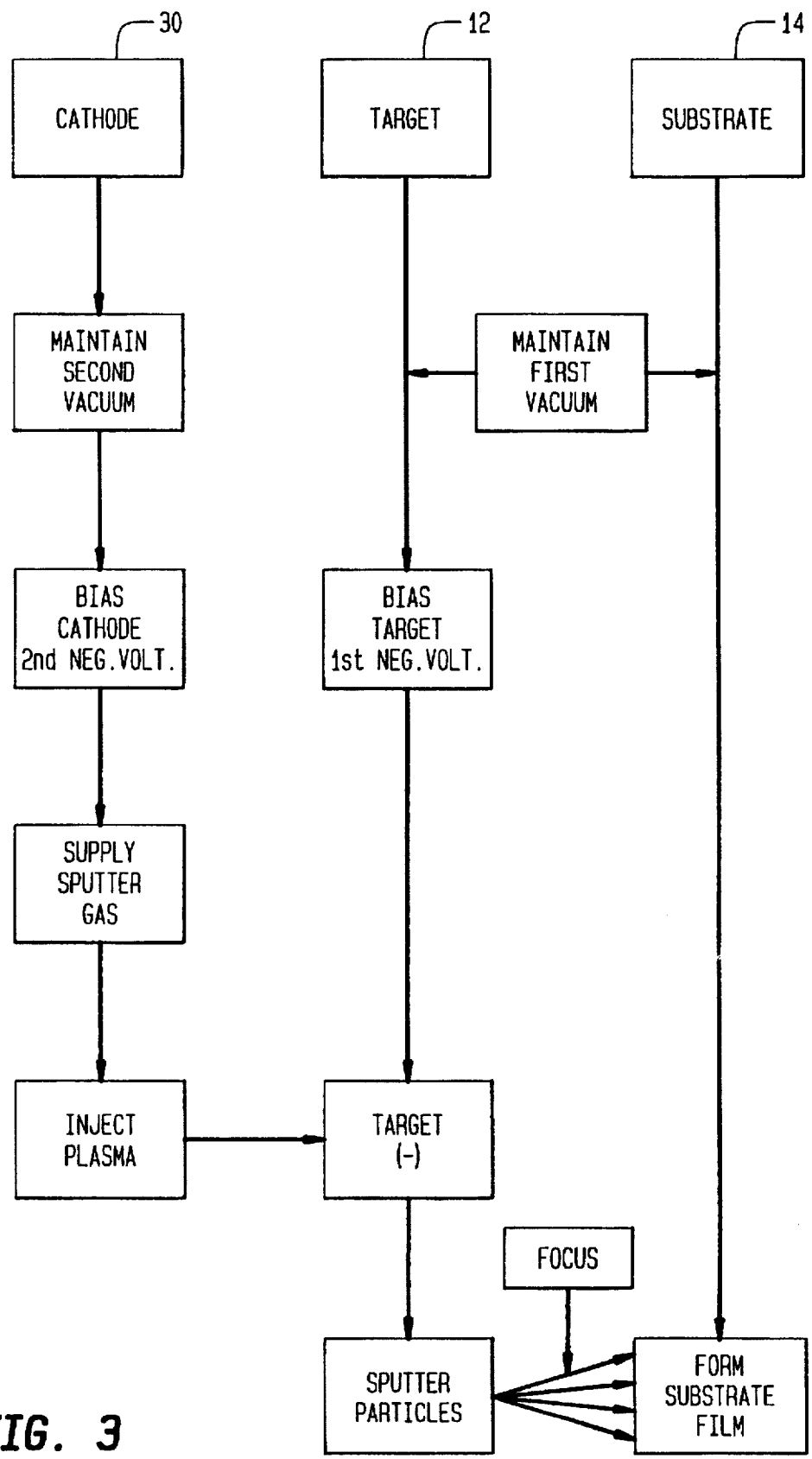
FIG. 3 is a flowchart representation of exemplary steps of a sputtering method in accordance with the present invention wherein plasma formation is decoupled from sputtering.

FIG. 3 is a flowchart representation of exemplary steps in the sputtering process which may be examined in conjunction with the remaining apparatus Figures.

Returning again to FIGS. 1 and 2, the apparatus 10 further includes means in the form of a conventional DC power supply 24 for biasing the target 12 with a first negative voltage to effect a target bias. The power supply 24 is suitably joined by electrical leads to the target 12 for providing a negative potential thereat and to the main housing 16 for providing an anode or ground. The target power supply 24 controls operation of the sputtering process between the target 12 and the substrate 14. The substrate 14 itself may be maintained at any suitable electrical potential as desired for undergoing sputtered deposition in any number of known manners.

In accordance with a major objective of the present invention, a plasma 26 is produced or generated remotely and independently from the target 12 to decouple plasma production from sputtering and thereby allow each process to be individually optimized for significantly improving both plasma production and the sputtering process, concurrently, for enjoying substantially increased sputtering yield and rate. In the present invention, the target 12 itself, although being maintained at a negative potential, does not define the cathode for use in producing the plasma 26, but defines solely the source of sputtered particles to be deposited on the substrate 14. The plasma 26 may be externally generated by any suitable apparatus.

More specifically, and for example, a first plasma generator in the form of a cathode housing or box 28 is disposed inside the main housing 16 and defines an enclosed injection or plasma chamber 28a, and also includes an injection port 28b in the exemplary form of a vertical or longitudinal slot or slit along one side thereof defining a face spaced laterally from one side of the target 12. One, and preferably a plurality of spaced apart cathodes 30 dedicated specifically for plasma generation are suitably mounted inside the plasma chamber 28a adjacent to the slit 28b. Means in the form of a second vacuum pump 22b are suitably joined in flow communication with the plasma chamber 28a for drawing and maintaining a second vacuum pressure $P_2$ therein in which the cathodes 30 are disposed.

Means in the form of another conventional, preferably DC power supply designated generally 32 are suitably electrically joined to the cathodes 30 for independently biasing each cathode 30 with a second negative voltage to effect a corresponding cathode bias thereat, relative to the cathode box 28 for example.

Suitable means 34 are provided for supplying and channeling a suitable sputtering gas 34a adjacent to the cathodes 30 for producing the plasma 26, and for injecting the plasma through the slit 28b and between the target 12 and substrate 14 to effect sputtering by bombarding the target face 12a with positive ions and liberating target atoms and molecules, or simply particles, for condensing on the substrate 14 as sputtered particles to form a deposited film thereon. The gas supplying means 34 may take any conventional form including one or more containers for initially storing the gas 34a, valves, and conduits for carrying the gas into the cathode box 28 for discharge along the several cathodes 30 to produce the plasma which is in turn injected through the slit 28b toward the target 12 in the region between the target 12 and the substrate 14. The cathode box 28 allows the plasma 26 to be generated externally and remote from the sputtering process which separately occurs between the target 12 and the substrate 14 after the plasma is injected therebetween. In this way, plasma production in the cathode box 28 and the sputtering process within the main chamber 16a may be separately optimized for maximizing sputtering yield and rate without the compromises required in conventional apparatus where the sputtering target and plasma cathode are a single, common component, and the processes are coupled or interdependent.

Figure 4:
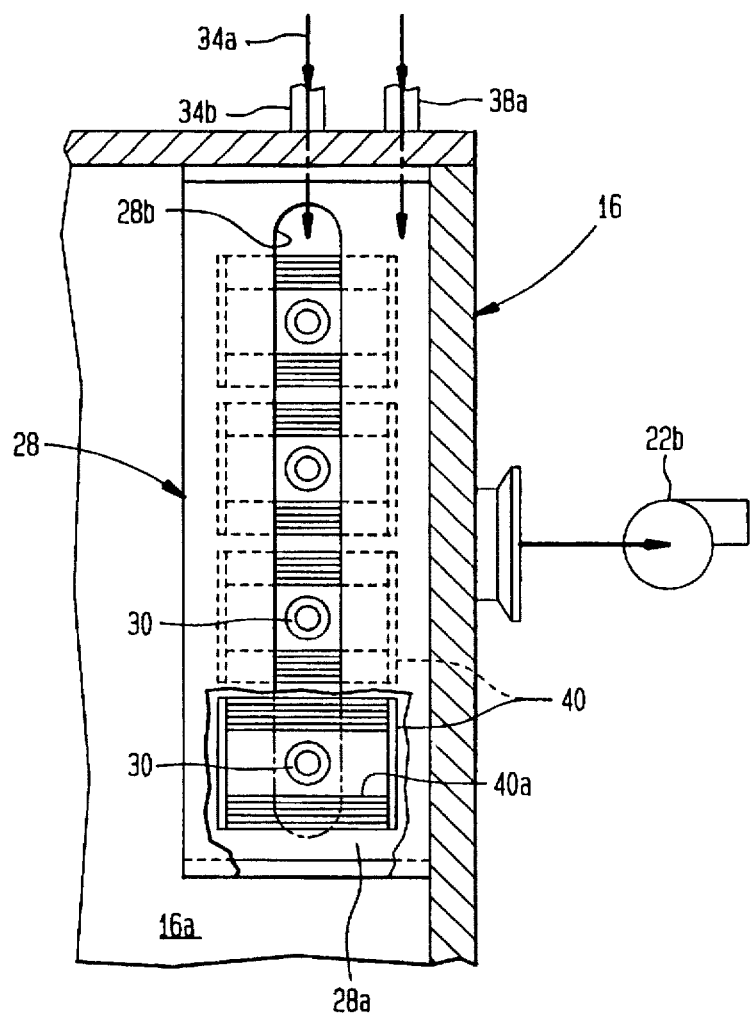
FIG. 4 is an elevational side view of the cathode box illustrated in FIG. 2 and taken along line 4—4, including a plurality of longitudinally spaced apart cathodes and cooperating magnets in accordance with an exemplary embodiment.
Figure 5:
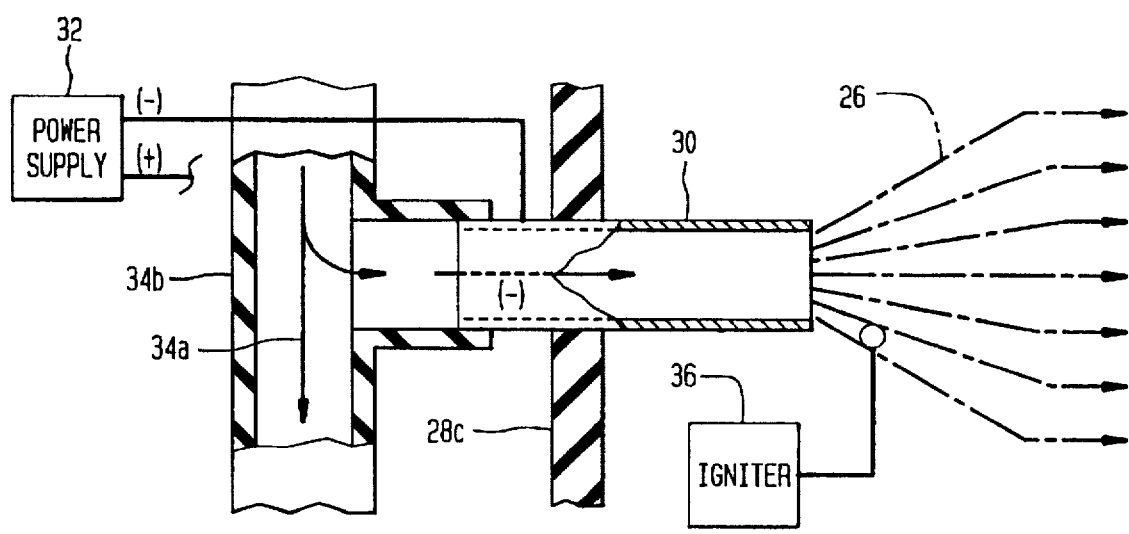
FIG. 5 is an enlarged, partly schematic view of an exemplary one of the cathodes disposed in the cathode box illustrated in FIGS. 2 and 4.

FIG. 4 illustrates a side view of the cathode box 28 shown in FIG. 1, with four exemplary vertically or transversely spaced apart cathodes 30 disposed therein, with FIG. 5 illustrating an enlarged one of the cathodes 30. Any suitable number or types of the cathodes 30 may be used and disposed inside the plasma chamber 28a and along the correspondingly sized slit 28b, and vertically aligned with one lateral edge of the target 12 to inject corresponding plasma fan streams which collectively form a larger plasma sheet across the entire target front face 12a.

Since the formation of the plasma 26 at each of the cathodes 30 effectively provides an electrical short circuit, each of the cathodes 30 must be separately powered and controlled for independently producing the respective plasmas 26. As shown in FIGS. 2 and 5, each of the cathodes 30 may be suitably mounted and supported in the cathode box 28 by a vertical frame 28c which may be in the form of a electrical insulator for electrically insulating each of the cathodes 30 from the cathode box 28. The gas supply 34 may include a manifold 34b suitably joined in flow communication with respective ones of the cathodes 30 using a suitable electrically insulating material for electrically isolating each of the cathodes 30.

As shown in FIG. 2, an exemplary embodiment of the power supply 32 for the cathodes 30 includes a voltage divider circuit with variable voltage obtained using corresponding variable resistors $32r$ to independently control voltage to each cathode 30. Or, individual, independent power supplies (not shown) may be used with each being suitably electrically connected with respective ones of the cathodes 30 for providing the second negative voltage thereat relative to the common cathode box 28 for example, which may be maintained at a suitable potential such as ground. In this way, the power supply 32 is effective for powering respective ones of the cathodes 30 to independently effect the cathode bias of each of the cathodes 30 and thereby control formation of the respective plasma 26 thereat.

As shown in FIG. 5, initiation or ignition of each of the plasmas 26 may be effected in any conventional manner, which may include an independent and respective igniter 36 operatively joined to one or more of the cathodes 30 as required. The igniter 36 operates to heat a local portion of the sputtering gas 34a for releasing ions to form a chain reaction to ignite the discharged gas 34a to produce the corresponding plasma 26. The igniter 36 may take any conventional form including those disclosed in U.S. Pat. No. 4,728,862 by Kovarik et al, incorporated herein by reference.

As shown in FIG. 5, each of the cathodes 30 is preferably hollow or tubular and may therefore be directly joined in flow communication with the gas manifold 34b for channeling therethrough a portion of the gas 34a. It is desirable to form a uniform, thin sheet plasma 26 across the target front face 12a which may be accomplished in accordance with the present invention by using a plurality of the laterally spaced apart cathodes 30, each having a relatively small orifice so that the plasma 26 may spread into a thin sheet collectively formed by the intersecting individual discharges from the cathodes 30. Although the cathode 30 is illustrated as being tubular, it may take any other suitable configuration including rectangular, for example, for improving formation of the thin plasma sheet, or needle cathodes for further increasing ionization efficiency.

Another significant advantage of decoupling plasma generation from sputtering is the ability to operate the cathodes 30 hot for maximizing ionization of the plasma 26. Accordingly, each cathode 30 is preferably formed of a refractory material, such as Tungsten, Tantalum, or Rhenium for example, with the power supply 32 being operated to power the respective cathodes 30 hot at a temperature greater than about 2200° C. to effect substantially 100% ionization of the plasma 26 at each of the cathodes 30. 100% ionization is about 2 orders of magnitude greater than the few percent ionization presently achieved in conventional sputtering apparatus.

Since a conventional sputtering apparatus combines the cathode with the target, the material of the target is limited by the specific type of sputtering desired. Various elements are used for the target or source including for example Ni, Cu, and Au. And suitable sputtering gases include argon (Ar), which is the most common, as well as He and Ne for example, as well as others in the event that reactive sputtering is desired. Since typical target materials are not refractory materials and cannot sustain high temperature, the conventional target/cathode must be operated relatively cold which limits the ionization of the plasma to only a few percent. In the present invention, the cathodes 30 are separate and distinct from the target 12 and therefore may be formed of refractory material and operated hot for maximizing ionization of the plasma 26.

In view of the hot operation of the cathodes 30, it is desirable to provide suitable means 38 as illustrated schematically in FIG. 1 for cooling the cathode box 28, as well as the target 12 if desired. The cooling means 38 may take any conventional form for circulating a suitable coolant such as water or gas through corresponding cooling conduits within the cathode box 28 and the target 12 for removing heat therefrom. The cooling means 38 therefore includes suitable pumps and heat exchanges for circulating the cooling fluid and removing heat from the cathode box 28 and the target 12 during operation.

For example, a first conduit 38a may be suitably wound through the walls of the cathode box 28 for circulating the cooling fluid therethrough. And, a second conduit 38b may be routed internally through the target 12 for circulating the cooling fluid therethrough. The second conduit 38b may pass through suitably sealed openings in the mounting plate 18a for maintaining effective vacuum in the main chamber 16a.

Independent plasma injection for decoupling plasma production from the sputtering process has numerous advantages. For example, the various operating parameters of both processes may now be separately adjusted and optimized for separately optimizing plasma production and the sputtering process for improving the resulting sputtering yield and sputtering rate of deposition on the substrate 14. Target bias and cathode bias and corresponding electrical current may now be independently optimized. And, the vacuum pressures in the main chamber 16a and in the plasma chamber 28a may also be independently optimized.

Target bias may now be optimized for maximizing sputtering yield, reducing the fraction of reflected primary bombarding ions, and for reducing implantation of plasma ions which unnecessarily heat the target 12. The target bias may be maintained at a different negative voltage than the cathode bias to maximize sputtering yield. For example, the target bias may be a few hundred volts, whereas the cathode bias may be substantially less and on the order of about 20 volts, for Argon sputtering gas for example. These bias voltages are substantially less than conventional target/cathode bias voltages of several kilovolts and provide corresponding advantages due primarily to operating the cathodes 30 hot as compared to the cold operation of a conventional cathode/target.

The current through the cathodes 30 may be about 20 amps for the argon gas example. And, most significantly, the ratio of the current over target area for the target 12 may be substantially greater than the ratio for the conventional cold target/cathode. Conventional current/area ratios are substantially less than about 1 amp per square centimeter, whereas in accordance with the present invention, current/area ratios for the target 12 may be substantially greater, and on the order of about 1 amp per square centimeter for significantly increasing sputtering rate without concern for extinguishing the externally produced plasma 26.

The decoupling of plasma formation from sputtering provides yet another significant improvement in the ability to adjust background pressure independently in both processes without regard for the compromises previously necessitated by the combined target and cathode. For example, the first and second vacuum pumps 22a,b may now be separately operated for maintaining and controlling the first vacuum pressure $P_1$ in the main chamber 16 significantly lower than the second vacuum pressure $P_2$ in the plasma chamber 28a for increasing both plasma production and sputtering yield simultaneously. This is not possible in conventional coupled target/cathode sputtering apparatus.

The first vacuum pressure $P_1$ may now be maintained at a minimum value to maximize mean-free-path of the sputtered particles and thereby minimize attenuation of the sputtered particles. Since the produced plasma sheet 26 is relatively thin and highly ionized close to about 100% due to its external formation, significantly low pressure operation between the target 12 and the substrate 14 may be obtained. This results in a reduction of loss of sputtered particles as a result of increased mean-free-path of the sputtered particles in the low pressure environment.

As shown in FIG. 2, the only fluid communication between the plasma chamber 28a and the main chamber 16a is through the plasma slit 28b, which is shown in more particularity in FIG. 4. The slit 28b is suitably sized in length and width for channeling the plasma 26 therethrough from the several cathodes 30 toward the target 12 without obstruction of the injected plasma 26. The slit 28b may therefore be made relatively small in flow area to provide a fixed resistance to pressure flow for maintaining a differential vacuum pressure between the main chamber 16a and the plasma chamber 28a. And, injection of the plasma 26 itself through the slit 28b further effectively seals the different vacuum pressures between the two chambers.

In this way, a substantially low vacuum pressure may be maintained in the main chamber 16a for reducing attenuation and improving the sputtering process. For example, a vacuum pressure $P_1$ of about 0.1 mTorr may be maintained in the main chamber 16a which is orders of magnitude less than the vacuum pressure typically found in a conventional sputtering apparatus in the exemplary range of 10–120 mTorr. And, the second vacuum pressure $P_2$ in the cathode box 28 is suitably higher, for example about 5–10 mTorr, for separately optimizing plasma production. Since the cathodes 30 may now be operated hot, close to 100% ionization of the plasma 26 may be obtained with these low vacuum pressures in the cathode box 28.

Due to the low ionization efficiency in conventional sputtering apparatus, the addition of a magnetic field is known for increasing ionization efficiency. As indicated above, ionization efficiency is relatively low on the order of a few percent in conventional sputtering apparatus since the target and cathode are combined in one component and must be operated at a compromise. However, the separately produced plasma 26 in the cathode box 28 may be fully ionized close to 100%, yet the sputtering process itself may be further enhanced by generating an external magnetic field around the injected plasma 26 to constrain the plasma into a thinner and more uniform plasma sheet across the target 12. The thin plasma sheet 26 further reduces attenuation of sputtered particles and loss thereof for further enhancing the sputtering rate of deposition on the substrate 14.

The plasma generating cathode box 28 may take various configurations as described above, with corresponding variations in the applied magnetic field for forming the plasma into a suitably thin sheet across the target 12. With the specific, multi-cathode 30 embodiment of the cathode box 28 illustrated in FIGS. 1, 2, and 4, corresponding means are provided for generating the desired magnetic flux or field around the injected plasma 26. FIGS. 1 and 2, the target 12 has a face 12a which faces the substrate 14, and the slit 28b is disposed adjacent to one side of the target face 12a for injecting the plasma 26 adjacent thereto. The magnetic field is preferably generated to position the plasma sheet 26 parallel and closely adjacent to the target face 12a for improving the sputtering process.

In the exemplary embodiment illustrated in FIGS. 1 and 2, separate means 40, 42 are provided for generating the magnetic field from opposite, lateral sides of the target 12 to constrain the plasma sheet 26 thereover. As indicated above, the cathodes 30 are transversely or vertically spaced apart from each other and aligned with the target 12 and produce and inject the plasma 26 to collectively form the plasma sheet. Correspondingly, it is desired to generate a plurality of magnetic fields around respective ones of the injected plasmas 26.

This is accomplished in accordance with an exemplary embodiment by a plurality of identical magnets 40 disposed in the plasma chamber 28a as shown in FIGS. 2 and 4, for example, around respective ones of the cathodes 30 to separately effect the magnetic field at each of the cathodes 30 which extends over the target 12 to constrain the plasma 26 injected from the cathodes 30 through the slit 28b into the common plasma sheet.

Figure 6:
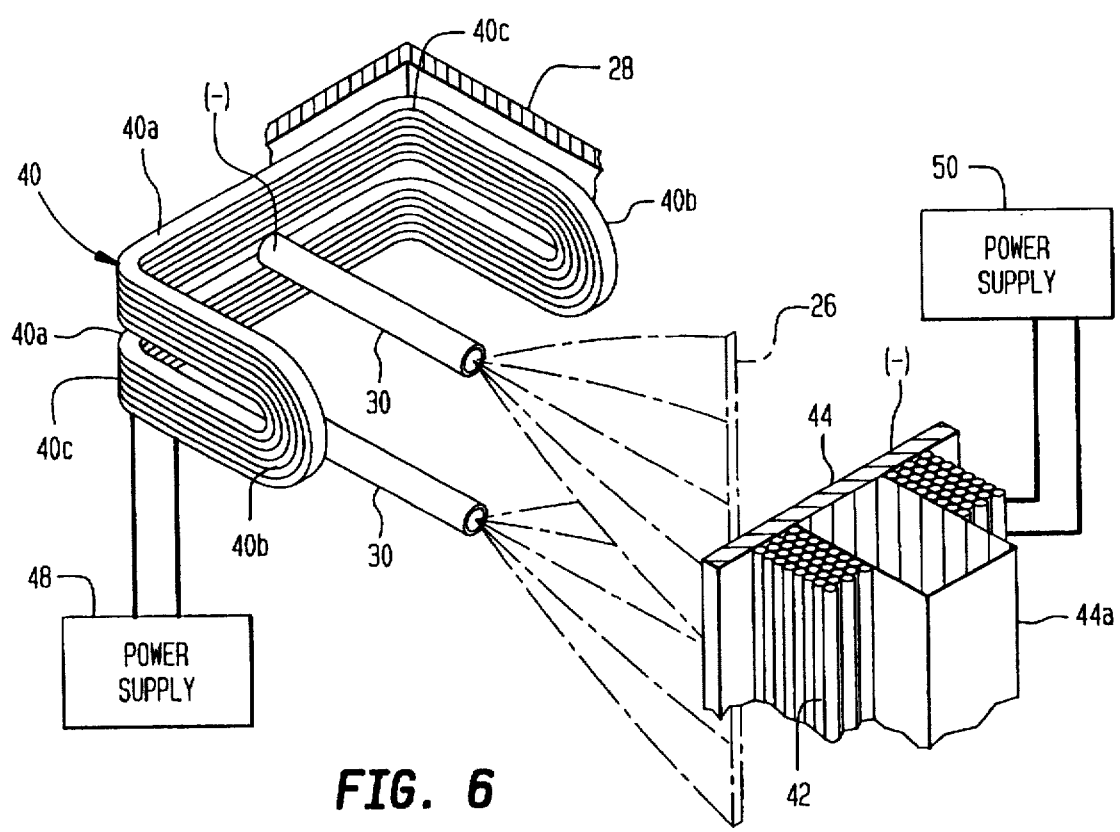
FIG. 6 is an isometric, partly schematic view of portions of the cathode box and reflector illustrated in FIG. 2 showing the formation of a plasma sheet from the cathodes thereof.

In the exemplary embodiment illustrated in FIGS. 1, 2, 4, and further in FIG. 6, the cathode magnets 40 are disposed in the cathode box 28 on one side of the target 12 upstream relative to the injected plasma 26, and a single, elongate second magnet 42 is disposed on the opposite side of the target 12 downstream relative to the plasma 26 for cooperating with the separate magnetic fields produced by the cathode magnets 40.

In the preferred embodiment illustrated in FIGS. 1, 2, and 6, a reflector 44 in the form of an imperforate, flat elongate plate is disposed in the main chamber 16a at one side of the target 12, and opposite from and spaced laterally from the cathode box 28 on the opposite side thereof for positioning the target 12 therebetween. The reflector 44 extends vertically and is aligned with the cathode box slit 28b in the path of the plasma sheet 26. Additional means 46 in the exemplary form of a conventional DC power supply are suitably electrically joined to the reflector 44 for biasing the reflector 44, relative to the main housing 16, with a suitable negative voltage to effect a reflector bias for reflecting electrons from the plasma sheet back into the plasma 26 for reducing loss thereof, and improving sputtering deposition.

As shown in FIGS. 1 and 2, the electron reflector 44 extends longitudinally and is aligned with the slit 28b. The reflector 44 preferably includes the magnet 42 extending longitudinally along the back side thereof for separately generating a magnetic field cooperating with the magnetic field from the cathode magnets 40 to constrain the plasma sheet from opposite, lateral sides of the target 12.

In the preferred embodiment illustrated for example in FIG. 6, the cathode magnets 40 are electromagnets, and the reflector magnet 42 is also an electromagnet both formed of suitable coils of wire. In the preferred embodiment, the cathode magnets 40 are powered by a common conventional DC power supply 48 suitably electrically joined in series thereto for generating the separate magnetic fields. Separate power supplies therefor could also by used if desired.

The reflector magnet 42 includes a separate conventional DC power supply 50 suitably electrically joined thereto for generating the magnetic field therefrom. As shown in FIGS. 2 and 6, the several cathode magnets 40 are aligned with each other and the respective cathodes 30 so that the separate magnetic fields generated therefrom cooperate with the single magnetic field generated by the reflector coil 42 for constraining the injected plasma 26 into a relatively thin and uniform sheet for enhancing the sputtering process.

As shown in FIG. 6, each of the cathode magnets 40 preferably comprises an oblong coil having two flat and straight, laterally spaced apart parallel legs 40a integrally joined to two semi-circular opposite ends or caps 40b which are also flat. The coil legs 40a include 90° bends 40c adjacent to the coil caps 40b to form a generally U-shaped configuration. The caps 40b extend from the legs 40a toward the cathode box slit 28b (see FIG. 2), with the legs 40a being oriented transversely across the width of the slit 28b (see FIG. 4). Each of the cathodes 30 is positioned in a respective one of the cathode magnets 40 equidistantly between the caps 40b thereof in the preferred embodiment.

The reflector magnet 42 is illustrated in FIGS. 2 and 6, and comprises an oblong coil extending longitudinally behind the reflector 44, with the legs of the magnet 42 being oriented perpendicularly or vertically relative to the legs of the cathode magnet 40 which extend horizontally. The reflector magnet 42 may be formed around an integral core 44a extending from the back side of the reflector 44, which may be formed of soft iron for magnetically cooperating with the reflector magnet 42.

The cathode and reflector electromagnets 40 and 42 cooperate together for effecting a suitable magnetic shield for constraining the plasma sheet 26 over the entire target face 12a. The plasma sheet 26 cooperates with the target 12 for liberating sputtered particles which depart the target face 12a with an angular distribution given by the positive integer powers of the cosine of the angular position measured from the axis perpendicular to the surface of the target face 12a. Accordingly, the vapor stream density or flux of the sputtered particles is directly proportional to the angular distribution. Due to angular dispersion in conventional sputtering apparatus such as planar magnetrons, non-uniform discharge distribution across the target results in non-uniform sputtering and poor target utilization. Target utilization is improved in the conventional rotatable magnetron cathode, but, the angular dispersion of the sputtered material is worse due to the convex geometry of the cathode having poor atomic particle optics. In this case, much of the sputtered material does not reach the substrate and is lost resulting in decreased sputtering efficiency.

In accordance with another feature of the present invention, uncoupling plasma production from the sputtering process allows the target 12 to have a curved target face 12a as illustrated in FIG. 1 to focus sputtered atoms and molecules on to the substrate 14, and therefore minimize loss of sputtered material. Target utilization close to about 100%, with greatly enhanced sputtered material flux or distribution reaching the substrate 14 may now be obtained.

As illustrated in FIG. 1, the target face 12 may now be specifically contoured to focus the sputtered particles on the substrate 14. As shown in the front view of FIG. 2, the target face 12a is straight longitudinally along the cathode box slit 28b, and along the transverse extent of the plasma sheet 26 which is directed parallel thereacross. As shown in FIG. 1, the target face 12a is laterally concave between the cathode box 28 and the reflector 44 and has a predetermined radius of curvature R with the origin thereof being on the substrate side of the target 12 to focus the sputtered particles liberated from the target face 12a on the substrate 14 along a focal line extending perpendicular to the propagation direction of the plasma 26.

The carriage 20 illustrated in FIG. 1 may therefore be operated to laterally translate the substrate 14 between the cathode box 28 and the reflector 24 for ion plating in turn succeeding portions of the surface of the substrate 14 along the focal line thereon.

As shown in FIG. 1, the cathodes 30 may be correspondingly angled for injecting the plasma 26 along a concave arc corresponding with the concave arc of the target face 12a. The respective cathode magnets 40 and reflector magnet 42 may be suitably adjusted in position for assisting to constrain the plasma sheet 26 along this arc closely adjacent and parallel to the target face 12a.

Figure 7:
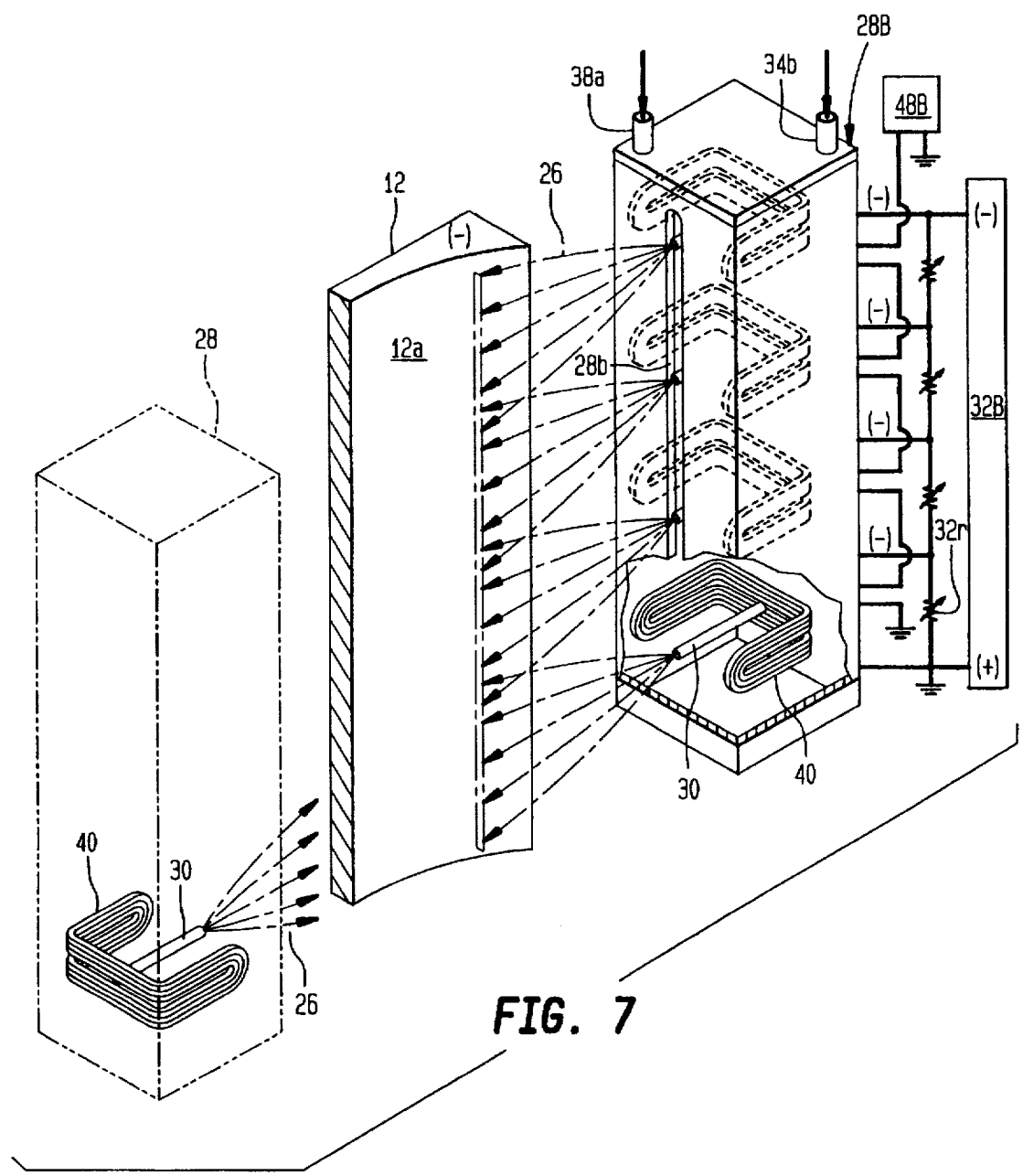
FIG. 7 is an isometric, partly schematic view of a pair of substantially identical cathode boxes disposed adjacent to a target in the configuration illustrated in FIG. 2 in accordance with a second embodiment of the present invention.

Illustrated schematically in FIG. 7 is an alternate embodiment of the present invention being substantially identical to the apparatus 10 illustrated in FIG. 1 except instead of using the reflector 44 and cooperating reflector magnet 42, a second plasma generator or cathode box designated 28B is disposed in the main chamber 16a spaced from the first cathode box 28 on the opposite side of the chamber 16a for positioning the target 12 laterally therebetween. The second cathode box 28B is illustrated in phantom in FIG. 1. The second cathode box 28B may be similarly joined to the second vacuum pump 22b for maintaining a substantially equal vacuum pressure $P_2$ therein.

As shown in FIG. 7, the second cathode box 28B is substantially identical to the first cathode box 28 in a mirror image for injecting the plasma 26 from both first and second boxes 28, 28B towards each other along the target face 12a to collectively form the plasma sheet thereover. Like the first cathode box 28, the second cathode box 28B includes a separate power supply 32B having a voltage divider for independently powering the corresponding cathodes 30, which are preferably equal in number to those in the first cathode box 28. And, the cathode magnets 40 in the second box 28B are powered by a separate power supply 48B like the power supply 48 for the first cathode box 28. The cathode power supply 32B, however, must be configured to ensure independent production of plasma 26 from each of the cathodes 30 powered thereby.

In the embodiment illustrated in FIG. 7, the opposing cathode magnets 40 in both boxes 28, 28B help constrain the plasma sheet injected from both sides of the target 12, and therefore the separate reflector 44 and reflector magnet 42 are not required in this embodiment. By externally injecting the plasma 26 on both lateral sides of the target 12, wider targets 12 and correspondingly wider substrates 14 may be utilized. The target 12 illustrated in FIG. 7 may be identical in contour to the target illustrated in FIG. 1 to focus the sputtered particles on the substrate 14. The target face 12a is straight longitudinally along the slit 28b of both boxes 28, 28B, and concave laterally between the first and second boxes to focus the sputtered particles on the substrate 14.

In the exemplary embodiment of the first cathode box 28 illustrated in FIG. 1, the slit 28b is disposed in a side face which is preferably flat or planar. And, the side face may include a plurality of parallel conduits therein for circulating the cooling fluid for cooling the face during operation.

Figure 8:
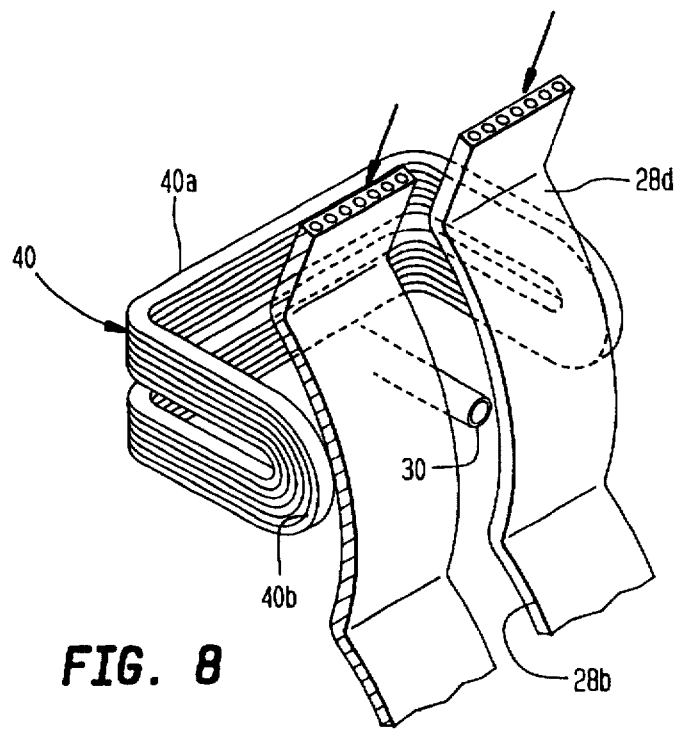
FIG. 8 is an isometric schematic view of a portion of the cathode box illustrated in FIG. 2 in accordance with another embodiment of the invention having a serpentine face cooperating with the magnets therein.

In FIG. 8, a portion of the cathode box 28 is illustrated wherein the slit 28b is disposed in a side face 28d which instead of being flat is preferably serpentine longitudinally along the slit 28b corresponding with respective ones of the cathode magnets 40. In this way, the serpentine undulations of the box face 28d may be positioned closely adjacent to and wrap partly around the semi-circular magnet caps 40b for improving the magnetic field generated by the cathode magnets 40. The box face 28d may be formed of a magnetic material which may act as a core for adjusting the magnetic field generated by the cathode magnets 40. Also shown in FIG. 8 are portions of internal conduits extending through the box face 28d which are suitably connected to the cooling means 38 illustrated in FIG. 1 for channeling the cooling fluid therethrough and cooling the box face 28d during operation.

Disclosed above are various embodiments of an improved method and apparatus for sputtering a film on the substrate 14. In view of the complex physics associated with generating plasma and ion plating using the sputtering process, only exemplary benefits have been presented. Target bias and cathode bias, and corresponding currents, may now be separately optimized for maximizing performance of each and thereby maximizing the resulting sputtering rate of deposition on the substrate 14. And, the corresponding vacuum pressures $P_1$ and $P_2$ of the main chamber 16a and in the cathode box 28 may also be optimized for optimizing performance of plasma generation and sputtering. And, the ability to now focus the sputtered particles from the concave target face 12a further enhances the sputtering process by reducing the loss of sputtered particles and thereby improving both target utilization and sputtered particle deposition on the substrate 14.

In the embodiment illustrated in FIG. 1, a single substrate 14 is disposed in the main chamber 16 spaced from the target 12. In an alternate embodiment (not shown), the main housing 16 may be configured in a mirror arrangement relative to the substrate 14 with corresponding targets 12 on opposite sides of the substrate 14 cooperating with corresponding ones of the cathode box 28 and reflector 44. The carriage 20 would be suitably configured to support the substrate 14 from its perimeter and leave exposed both top and bottom surfaces of the substrate 14. Two plasma sheets may then be formed on opposite sides of the substrate 14 adjacent to respective ones of the two targets 12 for simultaneously ion plating both sides of the substrate 14 if desired. Or, two substrates 14 could be positioned in the center of the main chamber 16a with the corresponding targets 12 on opposite sides thereof being used for ion plating respective surfaces of each of the substrates 14. In this way, more surface area of one or more substrates 14 may be simultaneously ion plated in a common main housing 16.

The invention is applicable to any type of substrate that requires sputter deposition for enjoying the improved benefits thereof. For example, it may be practiced for coating optical devices like mirrors, reflectors, tubes, and cylinders formed of metal, plastic, or glass. It may be used to coat mechanical devices, such as tools with a suitable wear coating to improve the useful life thereof.

Of particular benefit, not possible with conventional sputtering apparatus, the invention may be used for coating the inside, in addition to external, surfaces of any type of substrate. For example, the inside surfaces of springs, and simple cylinders such as those found in combustion engines, or in air or hydraulic devices, may now be sputtered deposited with coatings to improve wear life. Similarly, the inside surfaces of gun barrels ranging in size from small handguns to large military cannons may now be sputtered coated for improved performance. The inside surfaces of fluid carrying tubes may also be sputtered coated for improving handling and transferring of various products such as abrasive or corrosive materials. And, the inside surfaces of tools and cutters may now be sputter coated to improve cutting efficiency and improve useful life.

Figure 9:
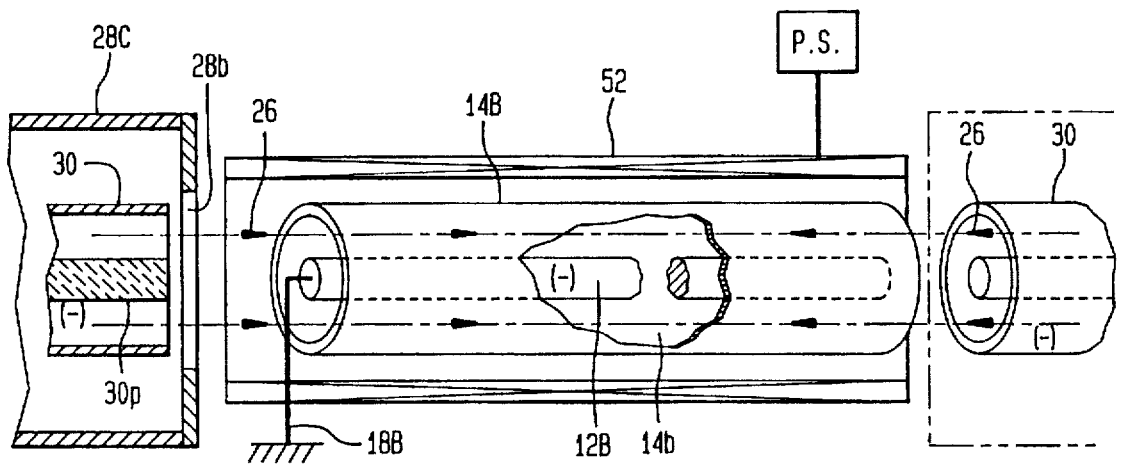
FIG. 9 is a partly sectional schematic view of a sputtering deposition apparatus in accordance with another embodiment of the present invention having an annular substrate, internal target, and an external electromagnet.
Figure 10:
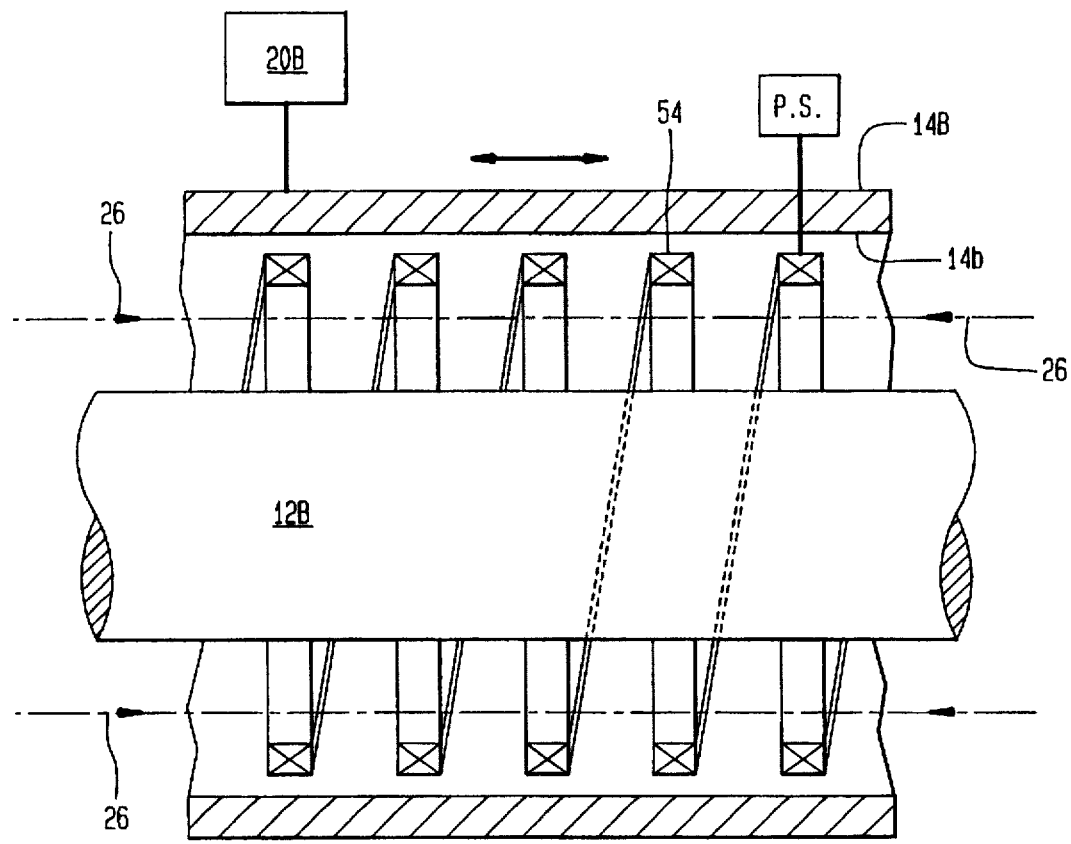
FIG. 10 is a partly sectional schematic view of a sputtering deposition apparatus in accordance with another embodiment of the present invention like FIG. 9 but including an internal electromagnet.

One exemplary modification of the FIG. 1 embodiment configured for sputter coating the inside of a hollow, annular substrate 14B in the exemplary form of a simple tube is illustrated in FIGS. 9 and 10. The substrate 14B is schematically representative of any hollow device such as flow pipes, gun barrels, coil springs, cylinders, and cutting tools (without internal cutting teeth being illustrated) which are open at least at one end into which the plasma 26 may be injected. And, the substrate 14B includes a radially inner surface 14b upon which it is desired to sputter deposit a coating for any useful purpose, such as providing a wear coating. Although the inner surface 14b is shown as smooth, it may be in any suitable form including projections such as cutting teeth.

The target mounting means 18B make take any suitable form such as a stationary supporting arm to position the target 12B at least in part inside the substrate 14B from one, or both, ends thereof. In this embodiment, the target 12B is a solid, cylindrical rod disposed coaxially inside the substrate to define a suitable flow annulus therebetween through which the plasma 26 may be injected.

The cathode box 28C in this embodiment is simply configured for containing a single hollow cathode 30 like those illustrated in FIG. 1, which is similarly operated for generating the plasma 36 externally of the substrate 14B, which itself is contained in a suitable main vacuum chamber like chamber 16 illustrated in FIG. 1. In this way, the plasma 26 generated in the cathode 30 may be injected through the box port 28b, in the simple form of a circle, and into an open end of the substrate 14B disposed adjacent to the port 28b for injecting the plasma 26 inside the substrate along the target 12B for sputter depositing the film on the substrate inner surface 14b.

In this exemplary embodiment, the target 12B is a cylindrical rod, and accordingly, the cathode 30 is coaxially aligned therewith for injecting the plasma 26 as an annulus axially along the entire perimeter thereof. The substrate inner surface 14b is therefore simultaneously coated around the inner perimeter thereof. Furthermore, the cathode 30 may also include a cylindrical center plug 30p suitably supported at an upstream end thereof, by radial struts for example. The plug 30p is disposed coaxially therein to define a flow annulus, and is coaxially aligned with the target 12B for injecting the annulus of plasma 26 from the flow annulus in the cathode 30 through the corresponding flow annulus in the substrate 14B for 360° sputter deposition coating.

FIG. 9 also illustrates that two of the cathodes 30 may be used for simultaneously injecting the plasma 26 into both, opposite ends of the substrate 14B if desired.

As indicated above, it is desirable to generate an external magnetic field around the injected plasma 26 to constrain the plasma 36 into a thin sheet along the target to improve sputtering and deposition. In FIG. 9, this is accomplished by using means 52 in the exemplary form of an electromagnetic solenoid or winding coil for generating the external magnetic field outside of the substrate 14B. The solenoid 52 and its corresponding power supply are mounted outside the substrate 14B, with the solenoid being sized to closely surround the substrate 14B coaxially therewith. This embodiment is useful for constraining the plasma when the substrate 14B is formed of a non-magnetic material which does not adversely affect the external magnetic field being generated by the solenoid.

However, if the substrate is formed of a magnetic material through which the transmission of a magnetic field is hindered, then FIG. 10 illustrates a further modification wherein the magnetic field generating means 54 is disposed inside the substrate 14B for generating the external magnetic field around the injected plasma 26. The means 54 is shown in the exemplary form of a plurality of individual coils, axially spaced apart from each other, and having a suitably small electrical lead therebetween for joining the coils in series with a suitable power supply suitably mounted outside the substrate 14B for example.

The coils 54 are suitably supported inside the substrate 14B coaxially therewith, and receive therethrough the injected plasma 26 which is magnetically constrained thereby to improve the sputtering and deposition process. The deposition occurs between the spaces provided by the adjacent coils, with the coils providing shadows on the substrate which are hidden from the deposition. In this embodiment, therefore, the carriage 20B is configured to axially translate the substrate 14B and the shadows for coating the shadow regions as well.

Figure 11:
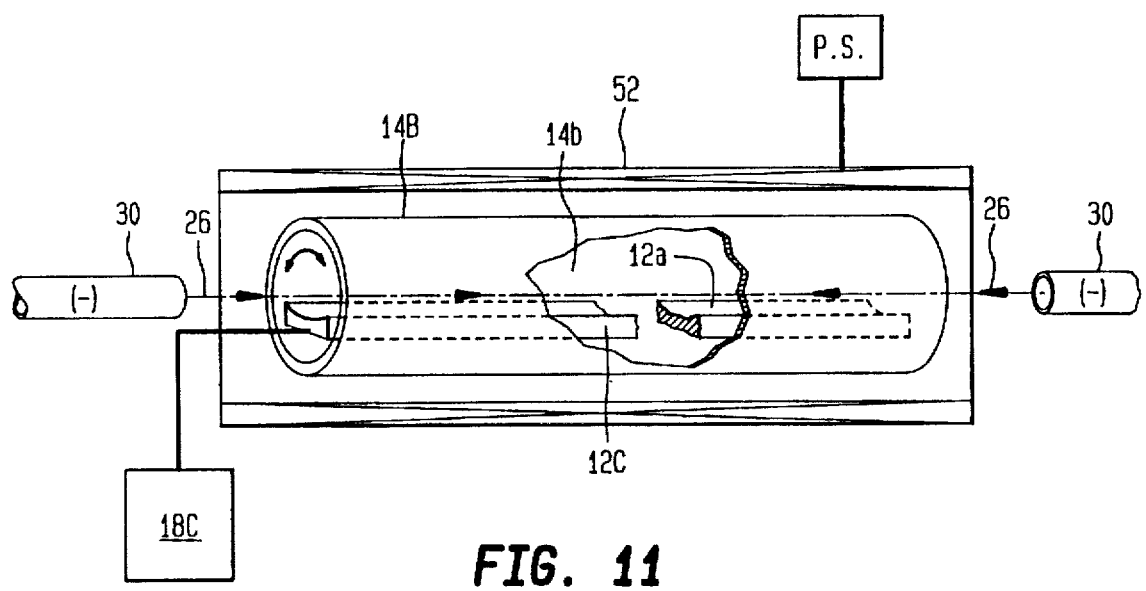
FIG. 11 is a partly sectional schematic view of a sputtering deposition apparatus in accordance with another embodiment of the present invention having an annular substrate, an internal focussing target, and an external electromagnet.
Figure 12:
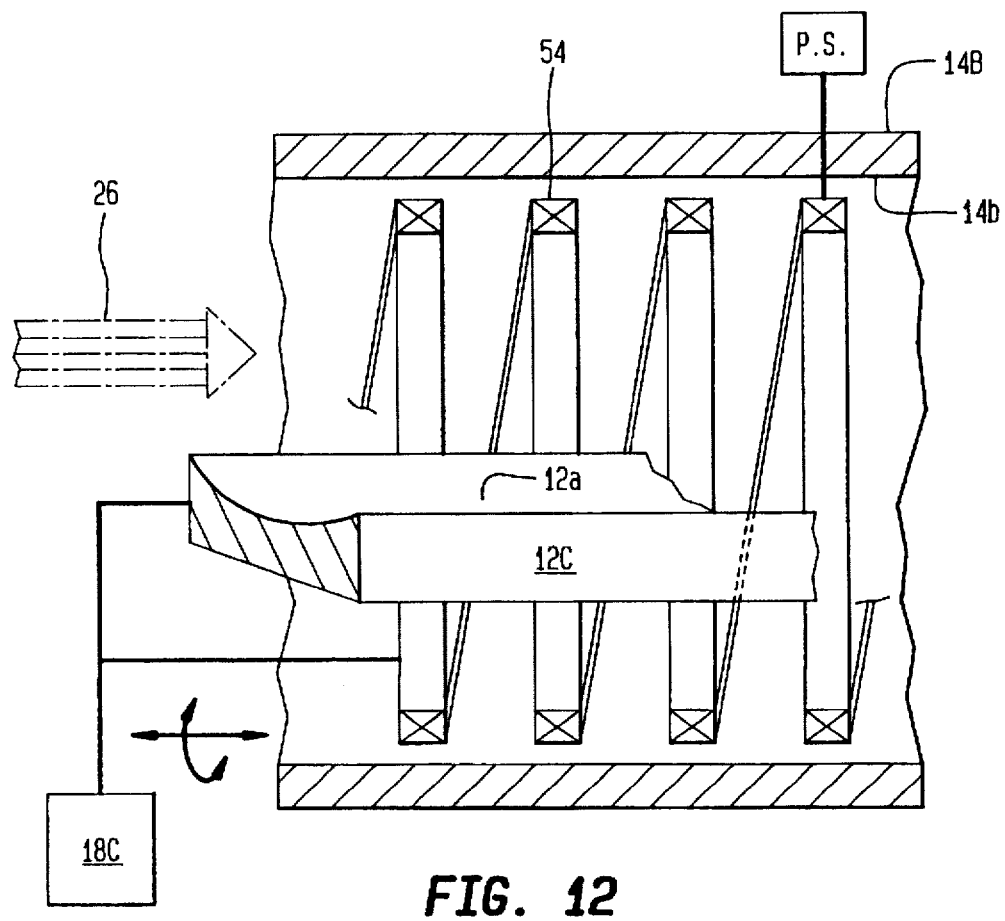
FIG. 12 is a partly sectional schematic view of a sputtering deposition apparatus in accordance with another embodiment of the present invention like FIG. 11 but including an internal electromagnet.

FIGS. 11 and 12 illustrate yet another modification of the invention. In this embodiment, the cathode is again a hollow cylinder without the center plug 30p. The target 12C, however, is now in the form of a solid rod disposed parallel to and radially offset from the cathode 30 for receiving the plasma 26 therefrom. The target 12C has a concave front face 12a extending axially along one side thereof, and is aligned with the cathode 30 for receiving the plasma 26 thereacross. The concave face 12a, like the one illustrated in FIG. 1, is used to focus the sputtered particles on the substrate inner surface 14b.

The target mounting means 18C in this embodiment are configured for providing relative movement between the target 12C and the substrate 14B for sweeping or spreading the sputtered particles across the inner surface 14b thereof. Since the concave face is directional, the mounting means either rotate the target 12C, or the substrate 14B may instead be rotated, so that sweeping of the target 12C circumferentially around the centerline of the substrate 14B coats the inner surface 14b in turn. In FIG. 4, the external electromagnet 52 may be used like in FIG. 9.

In FIG. 12, the internal electromagnet 54 may be used like in FIG. 10, along with the directional target 12C. The target mounting means 18C may support both the target 12C and the electromagnet 54 and rotate them together inside the substrate 14B. Or, the substrate 14B may be rotated relative to the target 12C and the electromagnet 54, if desired.

Although specific a specific configuration of the internal electromagnet 54 has been shown in FIGS. 10 and 12, it may take other suitable forms as well. For example, periodic or axially spaced apart permanent magnets could also be used.

And, axially extending coil wires may be used and scanned circumferentially for uncovering the shadows created thereby.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters patent of the United States is the invention as defined and differentiated in the following claims:

We claim:

1. A method of sputtering particles from a target as a film on a substrate comprising:

maintaining said target and said substrate in a first vacuum facing each other;

biasing said target with a first negative voltage to effect a target bias;

producing a plasma from a sputtering gas to provide positive ions in plasma production;

injecting said plasma between said target and said substrate to provide injected plasma to effect sputtering by bombarding said target with said positive ions and liberating target particles for condensing on said substrate as sputtered particles to form said film; and decoupling said plasma production from said sputtering, with said plasma being produced remotely and independently from said target under a different vacuum pressure and voltage than said first vacuum and target bias, and under separate control.

2. A method according to claim 1 wherein said plasma production comprises:

maintaining a cathode in a second vacuum spaced from said target;

biasing said cathode with a second negative voltage to effect a cathode bias; and channeling said gas adjacent to said cathode for producing said plasma.

3. A method according to claim 2 further comprising:

maintaining said first vacuum at a lower pressure than said second vacuum for increasing both said plasma production and yield of said sputtering.

4. A method according to claim 2 further comprising maintaining said target bias at a different voltage than said cathode bias to maximize yield of said sputtering.

5. A method according to claim 2 further comprising:

maintaining said first vacuum at a different pressure than said second vacuum; and maintaining said target bias at a different voltage than said cathode bias.

6. A method according to claim 2 further comprising operating said cathode hot to effect substantially 100% ionization of said plasma.

7. A method according to claim 6 further comprising minimizing said pressure of said first vacuum to maximize mean-free-path of said sputtered particles.

8. A method according to claim 2 further comprising generating an external magnetic field around said injected plasma to constrain said plasma into a sheet across said target.

9. A method according to claim 8 wherein said target has a face facing said substrate, and further comprising:

injecting said plasma adjacent to said target face; and generating said magnetic field to position said plasma sheet parallel to said target face.

10. A method according to claim 9 further comprising generating said magnetic field from opposite, lateral sides of said target.

11. A method according to claim 10 further comprising:

producing and injecting said plasma from a plurality of said cathodes transversely spaced apart from each other, and aligned with said target to collectively form said plasma sheet; and generating a plurality of said magnetic fields around respective ones of said injected plasma.

12. A method according to claim 11 wherein each of said cathodes is hollow and said plasma is formed therein and discharged therefrom for injection adjacent to said target.

13. A method according to claim 9 further comprising contouring said target face to focus said sputtered particles on said substrate.

14. A method according to claim 2 wherein said substrate is hollow and annular, and includes a radially inner surface, and further comprising:

mounting said target inside said substrate; and injecting said plasma inside said substrate along said target for sputter depositing said film on said substrate inner surface.

15. A method according to claim 14 further comprising generating an external magnetic field around said injected plasma and outside said substrate to constrain said plasma into a sheet along said target.

16. A method according to claim 14 further comprising generating an external magnetic field around said injected plasma and inside said substrate to constrain said plasma into a sheet along said target.

17. An apparatus for effecting a method of sputtering particles from a target as a film on a substrate comprising:

a main housing defining a main chamber;

means for mounting said target inside said main chamber;

means for mounting said substrate inside said main chamber spaced from and facing said target;

means for drawing a first vacuum in said main chamber;

means for biasing said target with a first negative voltage to effect target bias;

a cathode box defining a plasma chamber and having an injection port along one side thereof;

a cathode mounted inside said plasma chamber adjacent to said port;

means for drawing a second vacuum in said plasma chamber;

means for biasing said cathode with a second negative voltage to effect a cathode bias;

means for supplying a sputtering gas adjacent to said cathode for producing a plasma to provide positive ions, and for injecting said plasma through said port and between said target and said substrate to effect said sputtering by bombarding said target with positive ions and liberating said target particles for condensing on said substrate as sputtered particles to form said film; and said first and second vacuum drawing means, and said target and cathode biasing means being effective for decoupling said plasma production from said sputtering, with said plasma being produced remotely and independently from said target under different vacuum pressure and voltage than said first vacuum and target bias, and under separate control.

18. An apparatus according to claim 17 wherein said first vacuum is at a lower pressure than said second vacuum for increasing both said plasma production and yield of said sputtering.

19. An apparatus according to claim 17 wherein said target bias is a different voltage than said cathode bias to maximize yield of said sputtering.

20. An apparatus according to claim 17 wherein said cathode is formed of a refractory material, and said cathode biasing means powers said cathode to operate hot to effect substantially 100% ionization of said plasma.

21. An apparatus according to claim 20 wherein said pressure of said first vacuum has a minimum value to maximize mean-free-path of said sputtered particles.

22. An apparatus according to claim 17 further comprising means for generating an external magnetic field around said injected plasma to constrain said plasma into a sheet across said target.

23. An apparatus according to claim 22 wherein:

said target has a face facing said substrate;

said port is disposed adjacent to said target face for injecting said plasma adjacent thereto; and said magnetic field is configured to position said plasma sheet parallel to said target face.

24. An apparatus according to claim 23 further comprising separate means for generating said magnetic field from opposite, lateral sides of said target.

25. An apparatus according to claim 24 wherein said cathode box defines a first cathode box further comprising:

a plurality of said cathodes transversely spaced apart from each other inside said plasma chamber and along said port in the form of a slit, and aligned with said target to collectively form said plasma sheet;

said cathode biasing means powering respective ones of said cathodes to independently effect said cathode bias of each of said cathodes;

said gas supplying means being operatively joined to each of said cathodes for supplying said gas adjacent thereto for producing individual plasmas thereat; and a plurality of cathode box magnets disposed in said plasma chamber around respective ones of said cathodes to separately effect said magnetic field at each of said cathodes to constrain said plasma injected therefrom through said slit into said sheet.

26. An apparatus according to claim 25 further comprising:

a reflector disposed in said main chamber at one side, opposite from and spaced laterally from said cathode box for positioning said target therebetween, and aligned with said cathode box slit; and means for biasing said reflector with a negative voltage to effect a reflector bias for reflecting electrons from said plasma sheet back into said plasma for reducing loss thereof.

27. An apparatus according to claim 26 wherein:

said reflector extends longitudinally and is aligned with said first cathode box slit;

said reflector includes an elongate magnet extending longitudinally along a back side thereof for separately generating a magnetic field cooperating with said magnet field from said cathode box magnets to constrain said plasma sheet from opposite, lateral sides of said target.

28. An apparatus according to claim 27 wherein:

said cathode box magnets are electromagnets; and said reflector magnet is an electromagnet.

29. An apparatus according to claim 28 wherein:

each of said cathode box magnets comprises an oblong coil having straight and parallel legs joined to semi-circular opposite caps, and said coil legs includes bends adjacent to said coil caps to form a generally U-shaped configuration, and said caps extend from said legs toward said cathode box slit, with said legs being oriented transversely across said slit;

each of said cathodes is positioned in a respective one of said cathode magnets between said caps thereof; and said reflector magnet comprises an oblong coil extending longitudinally behind said reflector.

30. An apparatus according to claim 29 wherein each of said cathodes is hollow and said plasma is formed therein and discharged therefrom for injection adjacent to said target.

31. An apparatus according to claim 30 wherein said target face is straight longitudinally along said cathode box slit, and concave laterally between said cathode box and said reflector to focus said sputtered particles on said substrate.

32. An apparatus according to claim 25 wherein:

said main chamber includes said first cathode box on one side, and a second cathode box spaced from said first cathode box on an opposite side for positioning said target laterally therebetween; and said second cathode box is substantially identical to said first cathode box in a mirror image for injecting said plasma from both first and second boxes towards each other along said target face to collectively form said plasma sheet thereover.

33. An apparatus according to claim 32 wherein each of said cathode box magnets is an electromagnet including an oblong coil having straight and parallel legs joined to semi-circular opposite caps, and said coil legs include bends adjacent to said coil caps to form a generally U-shaped configuration, and said caps extend from said legs toward said cathode box slit, with said legs being oriented transversely across said slit; and each of said cathodes is positioned in a respective one of said cathode box magnets between said caps thereof in both of said first and second cathode boxes.

34. An apparatus according to claim 33 wherein each of said cathodes is hollow and said plasma is formed therein and discharged therefrom for injection adjacent to said target.

35. An apparatus according to claim 34 wherein said target face is straight longitudinally along said cathode box slit, and concave laterally between said first and second cathode boxes to focus said sputtered particles on said substrate.

36. An apparatus according to claim 25 wherein said target face is straight longitudinally along said cathode box slit, and concave laterally thereacross to focus said sputtered particles on said substrate.

37. An apparatus according to claim 25 wherein said cathode box slit is sized in width for channeling said plasma therethrough toward said target, and for maintaining a fixed resistance to pressure flow for maintaining a differential vacuum pressure between said main chamber and said plasma chamber.

38. An apparatus according to claim 25 wherein said cathode box comprises a face including said slit therein, and said box face is serpentine longitudinally along said slit corresponding with respective ones of said cathode box magnets.

39. An apparatus according to claim 17 wherein:

said substrate is hollow and annular, and includes a radially inner surface;

said target mounting means positions said target inside said substrate; and said cathode box port is disposed adjacent to an open end of said substrate for allowing said cathode to inject said plasma inside said substrate along said target for sputtering depositing said film on said substrate inner surface.

40. An apparatus according to claim 39 further comprising means for generating an external magnetic field around said injected plasma to constrain said plasma into a sheet across said target.

41. An apparatus according to claim 40 wherein said magnetic field generating means are disposed outside said substrate.

42. An apparatus according to claim 40 wherein said magnetic field generating means are disposed inside said substrate.

43. An apparatus according to claim 40 wherein:

said cathode is tubular;

said target is cylindrical; and said cathode is coaxially aligned therewith for injecting said plasma axially along an entire perimeter thereof.

44. An apparatus according to claim 43 wherein said cathode includes a center plug disposed coaxially therein to define a flow annulus for injecting said plasma around said target.

45. An apparatus according to claim 40 wherein:

said cathode is tubular; and said target is a rod disposed parallel to and offset radially from said cathode for receiving said injected plasma therefrom.

46. An apparatus according to claim 45 wherein:

said target has a concave front face aligned with said cathode for receiving said plasma thereacross and for focusing said sputtered particles on said substrate inner surface; and said target mounting means are effective for providing relative movement between said target and said substrate for spreading said sputtered particles across said substrate inner surface.

47. A method according to claim 1 further comprising focusing said sputtered particles on said target.

* * * * *